United States Patent
Bismuto et al.

(10) Patent No.: US 11,156,497 B2
(45) Date of Patent: Oct. 26, 2021

(54) CONNECTED EPITAXIAL OPTICAL SENSING SYSTEMS COMPRISING A SECOND EPITAXIAL CHIP WITH A SECOND LIGHT SOURCE AND A SECOND DETECTOR TO DETECT LIGHT OF A FIRST LIGHT SOURCE

(71) Applicant: Apple Inc., Cupertino, CA (US)

(72) Inventors: Alfredo Bismuto, San Jose, CA (US); David I. Simon, San Francisco, CA (US); Jason Pelc, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/651,901

(22) PCT Filed: Sep. 25, 2018

(86) PCT No.: PCT/US2018/052669
§ 371 (c)(1),
(2) Date: Mar. 27, 2020

(87) PCT Pub. No.: WO2019/067450
PCT Pub. Date: Apr. 4, 2019

(65) Prior Publication Data
US 2020/0309593 A1 Oct. 1, 2020

Related U.S. Application Data

(60) Provisional application No. 62/566,027, filed on Sep. 29, 2017.

(51) Int. Cl.
*G01J 1/42* (2006.01)
*G01J 1/02* (2006.01)
*G01J 1/04* (2006.01)

(52) U.S. Cl.
CPC .......... *G01J 1/4257* (2013.01); *G01J 1/0252* (2013.01); *G01J 1/0425* (2013.01)

(58) Field of Classification Search
CPC ...... G01J 1/0252; G01J 1/0425; G01J 1/4257; G01J 2001/4242; H01S 5/0262;
(Continued)

(56) References Cited

U.S. PATENT DOCUMENTS 5,287,376 A 2/1994 Paoli
5,488,678 A 1/1996 Taneya
(Continued)

FOREIGN PATENT DOCUMENTS

EP 1403985 3/2004
EP 1432045 6/2004
(Continued)

OTHER PUBLICATIONS

International Search Report and Written Opinion dated Feb. 25, 2019, PCT/US2018/052669, 17 pages.
(Continued)

*Primary Examiner* — Que Tan Le
(74) *Attorney, Agent, or Firm* — Brownstein Hyatt Farber Schreck, LLP

(57) ABSTRACT

A device including a plurality of epitaxial chips is disclosed. An epitaxial chip can have one or more of a light source and a detector, where the detector can be configured to measure the optical properties of the light emitted by a light source. In some examples, one or more epitaxial chips can have one or more optical properties that differ from other epitaxial chips. The epitaxial chips can be dependently operable. For example, the detector located on one epitaxial chip can be configured for measuring the optical properties of light emitted by a light source located on another epitaxial chip by way of one or more optical signals. The collection of
(Continued)

epitaxial chips can also allow detection of a plurality of laser outputs, where two or more epitaxial chips can have different material and/or optical properties.

18 Claims, 12 Drawing Sheets

(58) Field of Classification Search
CPC .............. H01S 5/0683; H01L 25/167; H01L 27/14636; H01L 27/1469
USPC ........................................ 250/214.1, 214 R
See application file for complete search history.

(56) References Cited

U.S. PATENT DOCUMENTS

| | | | |
|---|---|---|---|
| 5,644,667 A | 7/1997 | Tabuchi | |
| 5,742,631 A | 4/1998 | Paoli | |
| 6,122,042 A | 9/2000 | Wunderman et al. | |
| 6,330,378 B1 | 12/2001 | Forrest | |
| 6,393,185 B1 | 5/2002 | Deacon | |
| 6,594,409 B2 | 7/2003 | Dutt et al. | |
| 6,628,686 B1 | 9/2003 | Sargent | |
| 6,657,723 B2 | 12/2003 | Cohen | |
| 6,795,622 B2 | 9/2004 | Forrest | |
| 6,892,449 B1 | 5/2005 | Brophy et al. | |
| 6,940,182 B2 | 9/2005 | Hilton et al. | |
| 6,947,639 B2 | 9/2005 | Singh | |
| 6,952,504 B2 | 10/2005 | Bi | |
| 6,987,906 B2 | 1/2006 | Nakama et al. | |
| 7,054,517 B2 | 5/2006 | Mossberg | |
| 7,058,245 B2 | 6/2006 | Farahi | |
| 7,079,715 B2 | 7/2006 | Kish | |
| 7,203,401 B2 | 4/2007 | Mossberg | |
| 7,203,426 B2 | 4/2007 | Wu et al. | |
| 7,209,611 B2 | 4/2007 | Joyner | |
| 7,245,379 B2 | 7/2007 | Schwabe | |
| 7,283,694 B2 | 10/2007 | Welch | |
| 7,314,451 B2 | 1/2008 | Halperin et al. | |
| 7,324,195 B2 | 1/2008 | Packirisamy et al. | |
| 7,366,364 B2 | 4/2008 | Singh | |
| 7,447,393 B2 | 11/2008 | Yan | |
| 7,460,742 B2 | 12/2008 | Joyner | |
| 7,477,384 B2 | 1/2009 | Schwabe | |
| 7,483,599 B2 | 1/2009 | Dominic et al. | |
| 7,526,007 B2 | 4/2009 | Chua et al. | |
| 7,558,301 B2 | 7/2009 | Lin et al. | |
| 7,680,364 B2 | 3/2010 | Nilsson | |
| 7,720,328 B2 | 5/2010 | Yan | |
| 7,885,302 B2 | 2/2011 | Eberhard | |
| 7,885,492 B2 | 2/2011 | Welch | |
| 7,974,504 B2 | 7/2011 | Nagarajan | |
| 8,300,994 B2 | 10/2012 | Welch et al. | |
| 8,559,775 B2 | 10/2013 | Babie et al. | |
| 8,564,784 B2 | 10/2013 | Wang et al. | |
| 8,724,100 B1 | 5/2014 | Asghari et al. | |
| 8,920,332 B2 | 12/2014 | Hong et al. | |
| 8,983,250 B2 | 3/2015 | Black et al. | |
| 9,020,004 B2 | 4/2015 | Jeong | |
| 9,031,412 B2 | 5/2015 | Nagarajan | |
| 9,110,259 B1 | 8/2015 | Black | |
| 9,135,397 B2 | 9/2015 | Denyer et al. | |
| 9,176,282 B2 | 11/2015 | Pottier | |
| 9,217,669 B2 | 12/2015 | Wu et al. | |
| 9,348,154 B2 | 5/2016 | Hayakawa | |
| 9,370,689 B2 | 6/2016 | Guillama et al. | |
| 9,405,066 B2 | 8/2016 | Mahgerefteh | |
| 9,543,736 B1 | 1/2017 | Barwicz et al. | |
| 9,620,931 B2 | 4/2017 | Tanaka | |
| 9,643,181 B1 * | 5/2017 | Chang ................ G01N 15/1459 | |
| 9,766,370 B2 | 9/2017 | Aloe et al. | |
| 9,804,027 B2 | 10/2017 | Fish et al. | |
| 9,829,631 B2 | 11/2017 | Lambert | |
| 9,880,352 B2 | 1/2018 | Florjanczyk | |
| 9,943,237 B2 | 4/2018 | Baker et al. | |
| 9,948,063 B2 | 4/2018 | Caneau et al. | |
| 10,009,668 B2 | 6/2018 | Liboiron-Ladouceur | |
| 10,132,996 B2 | 11/2018 | Lambert | |
| 10,238,351 B2 | 3/2019 | Halperin et al. | |
| 10,285,898 B2 | 5/2019 | Douglas et al. | |
| 10,310,196 B2 | 6/2019 | Hutchison | |
| 10,429,597 B2 | 10/2019 | ten Have et al. | |
| 10,529,003 B2 | 1/2020 | Mazed | |
| 10,687,718 B2 | 6/2020 | Allee et al. | |
| 10,852,492 B1 | 12/2020 | Vermeulen et al. | |
| 2005/0053112 A1 | 3/2005 | Shams-Zadeh-Amiri | |
| 2005/0063431 A1 | 3/2005 | Gallup et al. | |
| 2006/0002443 A1 | 1/2006 | Farber et al. | |
| 2008/0044128 A1 | 2/2008 | Kish et al. | |
| 2008/0310470 A1 | 12/2008 | Ooi et al. | |
| 2014/0029943 A1 | 1/2014 | Mathai et al. | |
| 2016/0224750 A1 | 8/2016 | Kethman et al. | |
| 2017/0164878 A1 | 6/2017 | Connor | |
| 2019/0339468 A1 | 11/2019 | Evans | |
| 2019/0342009 A1 | 11/2019 | Evans | |
| 2020/0152615 A1 | 5/2020 | Krasulick et al. | |
| 2020/0244045 A1 | 7/2020 | Bismuto et al. | |
| 2020/0253547 A1 | 8/2020 | Harris et al. | |
| 2020/0309593 A1 | 10/2020 | Bismuto et al. | |
| 2021/0033805 A1 | 2/2021 | Bishop et al. | |

FOREIGN PATENT DOCUMENTS

| | | |
|---|---|---|
| JP | 2008262118 | 10/2008 |
| WO | WO 01/014929 | 3/2001 |
| WO | WO 04/031824 | 4/2004 |
| WO | WO 05/091036 | 9/2005 |
| WO | WO 11/090274 | 7/2011 |
| WO | WO 17/040431 | 3/2017 |
| WO | WO 17/184420 | 10/2017 |
| WO | WO 17/184423 | 10/2017 |
| WO | WO 19/152990 | 8/2019 |
| WO | WO 20/106974 | 5/2020 |

OTHER PUBLICATIONS

U.S. Appl. No. 16/650,804, filed Mar. 25, 2020, Arbore et al.
U.S. Appl. No. 17/254,810, filed Dec. 21, 2020, Bishop et al.
Gonzalez-Sanchez et al., "Capacitive Sensing for Non-Invasive Breathing and Heart Monitoring in Non-Restrained, Non-Sedated Laboratory Mice," Sensors 2016, vol. 16, No. 1052, pp. 1-16.
Kybartas et al., "Capacitive Sensor for Respiratory Monitoring," Conference "Biomedical Engineering," Nov. 2015, 6 pages.
Lapedus, "Electroplating IC Packages—Tooling challenges increase as advanced packaging ramps up," *Semiconductor Engineering*, https://semiengineering.com/electroplating-ic-packages, Apr. 10, 2017, 22 pages.
Materials and Processes for Electronic Applications, Series Editor: James J. Licari, AvanTeco, Whittier, California, Elsevier Inc., 2009, 20 pages.
Worhoff et al., "Flip-chip assembly for photonic circuits," MESA+ Research Institute, University of Twente, Integrated Optical MicroSystems Group, The Netherlands, 12 pages.

* cited by examiner

CONNECTED EPITAXIAL OPTICAL SENSING SYSTEMS COMPRISING A SECOND EPITAXIAL CHIP WITH A SECOND LIGHT SOURCE AND A SECOND DETECTOR TO DETECT LIGHT OF A FIRST LIGHT SOURCE

CROSS-REFERENCE TO RELATED APPLICATIONS

This application is a national phase application under 35 U.S.C. § 371 of PCT/US2018/052669, filed Sep. 25, 2018, which claims the benefit of U.S. Provisional Patent Application No. 62/566,027, filed Sep. 29, 2017, which are hereby incorporated by reference in their entirety.

FIELD

This relates generally to a plurality of dependently operable epitaxial chips included in a device. More particularly, this relates to epitaxial chips each including a detector configured for measuring the optical properties of light emitted by a light source located on another epitaxial chip.

BACKGROUND

Optical sensing systems can be useful for many applications, such as trace gas detection, environmental monitoring, biomedical diagnostics, telecommunications, and industrial process controls. In some instances, it may be useful to measure the optical properties of light emitted by the light sources. For example, the optical properties of emitted light can be monitored to ensure that the light source is tuned to the targeted wavelength and/or targeted power density.

One way to be able to monitor the optical properties of light emitted by a light source can be to include a detector in the optical sensing system that directly measures the emitted light. The light source can be grown and processed separately on a different epitaxial chip than the detector, where optical traces can be used to route signals between the light source and the detector. Some optical sensing system can include an integrated photonics optical sensing system, which can include a plurality of light sources and detectors. One way to reduce the complexity and the number of epitaxial chips included in the optical sensing system can be to integrate the light source and the detector on the same epitaxial chip. Epitaxial chips can be configured to operate independently, where on the same epitaxial chip, the detector can measure the optical properties of the emitted light from the light source. In some instances, independent operation can lead to leakage current flowing from the light source through one or more conductive layers to the detector, where the leakage current can mask the detector current.

SUMMARY

A device including a plurality of epitaxial chips is disclosed. An epitaxial chip can have one or more of a light source and a detector, where the detector can be configured to measure the optical properties of the light emitted by a light source. In some examples, one or more epitaxial chips can have one or more optical properties (e.g., band structure) that differ from other epitaxial chips. For example, a collection of epitaxial chips can allow the optical sensing system to emit a broader range of wavelengths (e.g., red, green, and blue colors) than a single epitaxial chip. The epitaxial chips can be dependently operable. For example, the detector located on one epitaxial chip can be configured for measuring the optical properties of light emitted by a light source located on another epitaxial chip by way of one or more optical signals. The collection of epitaxial chips can also allow detection of a plurality of laser outputs, where two or more epitaxial chips can have different material and/or optical properties. Light sources located on one or more first epitaxial chips can be driven, while the detectors located on one or more second epitaxial chips can be configured for optical sensing during a first time period. During a second time period, the light sources located on the second epitaxial chip(s) can be driven, while the detectors located on the first epitaxial chip(s) can be configured for optical sensing. In some instances, the light source and the detector included in the same epitaxial chip can be electrically isolated by creating a trench that can be deeper than one or more (e.g., all) conductive layers included in the epitaxial wafer.

DETAILED DESCRIPTION

Figure 1:
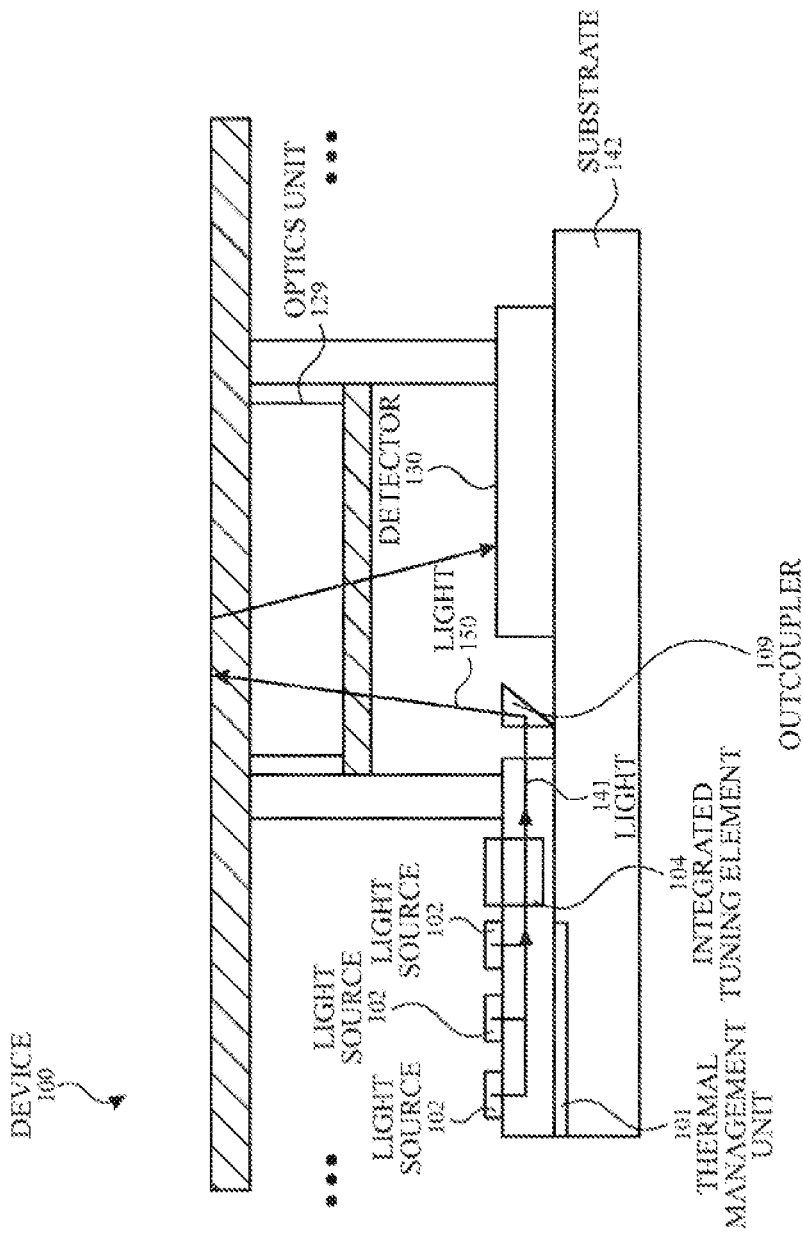
FIG. 1 illustrates a cross-sectional view of a portion of an exemplary device according to examples of the disclosure.

In the following description of examples, reference is made to the accompanying drawings in which it is shown by way of illustration specific examples that can be practiced. It is to be understood that other examples can be used and structural changes can be made without departing from the scope of the various examples.

Various techniques and process flow steps will be described in detail with reference to examples as illustrated in the accompanying drawings. In the following description, numerous specific details are set forth in order to provide a thorough understanding of one or more aspects and/or features described or referenced herein. It will be apparent, however, to one skilled in the art, that one or more aspects and/or features described or referenced herein may be practiced without some or all of these specific details. In other instances, well-known process steps and/or structures have not been described in detail in order to not obscure some of the aspects and/or features described or referenced herein.

Further, although process steps or method steps can be described in a sequential order, such processes and methods can be configured to work in any suitable order. In other words, any sequence or order of steps that can be described in the disclosure does not, in and of itself, indicate a requirement that the steps be performed in that order. Further, some steps may be performed simultaneously despite being described or implied as occurring non-simultaneously (e.g., because one step is described after the other step). Moreover, the illustration of a process by its description in a drawing does not imply that the illustrated process is exclusive of other variations and modification thereto, does not imply that the illustrated process or any of its steps are necessary to one or more of the examples, and does not imply that the illustrated process is preferred.

A device including a plurality of epitaxial chips is disclosed. An epitaxial chip can have one or more of a light source and a detector, where the detector can be configured to measure the optical properties of the light emitted by a light source. In some examples, one or more epitaxial chips can have one or more optical properties (e.g., band structure) that differ from other epitaxial chips. For example, a collection of epitaxial chips can allow the device to emit a broader range of wavelengths (e.g., red, green, and blue colors) than a single epitaxial chip. The epitaxial chips can be dependently operable. For example, the detector located on one epitaxial chip can be configured for measuring the optical properties of light emitted by a light source located on another epitaxial chip by way of one or more optical signals. The collection of epitaxial chips can also allow detection of a plurality of laser outputs, where two or more epitaxial chips can have different material and/or optical properties. Light sources located on a one or more first epitaxial chips can be driven, while the detectors located on one or more second epitaxial chips can be configured for optical sensing during a first time period. During a second time period, the light sources located on the second epitaxial chip(s) can be driven, while the detectors located on the first epitaxial chip(s) can be configured for optical sensing. In some instances, the light source and the detector included in the same epitaxial chip can be electrically isolated by creating a trench that can be deeper than one or more (e.g., all) conductive layers included in the epitaxial wafer.

Representative applications of methods and apparatus according to the present disclosure are described in this section. These examples are being provided solely to add context and aid in the understanding of the described examples. It will thus be apparent to one skilled in the art that the described examples may be practiced without some or all of the specific details. Other applications are possible, such that the following examples should not be taken as limiting.

Optical sensing systems can have many uses in portable (e.g., compact-sized) electronic devices. FIG. 1 illustrates a cross-sectional view of an exemplary portion of a device according to examples of the disclosure. The device 100 can include a plurality of light sources 102, a detector 130, and an optics unit 129. The term "device" as used throughout can refer to a single standalone component that can operate alone for a given function, or can refer to a system including multiple components that operate together to achieve the same functions. The device 100 can include optical components such as a plurality of light sources 102, a detector 130, and an optics unit 129. As used throughout this specification, a system, such as an optical sensing system, can include a device.

The light sources 102 can be configured to emit light 141. The light sources 102 can be any type of source capable of generating light including, but not limited to, a laser, a light emitting diode (LED), an organic light emitting diode (OLED), an electroluminescent (EL) source, a quantum dot (QD) light source, a super-luminescent diode, a super-continuum source, a fiber-based source, or a combination of one or more of these sources. In some examples, one or more light sources 102 can be capable of emitting a plurality of wavelengths (e.g., a range of wavelengths) of light. In some examples, one or more of the light sources 102 can emit a different wavelength range of light (e.g., different colors in the spectrum) than the other light sources 102.

Light from the light sources 102 can be combined using one or more integrated tuning elements 104, optical traces (not shown), one or more multiplexers (not shown), and/or other optical components. In some examples, the integrated tuning elements 104, the optical traces, and the multiplexer(s) can be disposed on a substrate 142. The substrate 142 can be included in a single optical platform, such as an integrated silicon photonics chip. An integrated silicon photonics chip can also be known as a photonics integrated chip (PIC). The device 100 can also include a thermal management unit 101 for controlling (e.g., heating or cooling, including stabilization) the temperature of the light sources 102. One or more outcouplers 109 can be coupled to the integrated tuning elements 104, optical traces, and/or multiplexers. The outcouplers 109 can be configured to focus, collect, collimate, and/or condition (e.g., shape) an incident light beam to form light 150, which can be directed towards the system interface (e.g., the external housing of the device 100).

Light can be light emitted from the light sources 102, collimated by the outcouplers 109, and transmitted through the optics unit 129. At least a portion of light 150 can return to the device 100. The return light can be transmitted through the optics unit 129 and can be incident on the detector 130. In some examples, the return light may transmit through different optics included in the optics unit 129 than light 150.

In some instances, it may be useful to measure the optical properties of light emitted by the light sources. For example, the optical properties of light 148 can be measured to ensure that the light source is tuned to a targeted wavelength(s). One way to be able to monitor the optical properties of emitted light can be to include a detector that directly measures the emitted light 148. Some device s can include a plurality of light sources and detectors, which can lead to a large number of epitaxial chips if a large number of wavelengths is desired and the light sources and the detectors are located on separate epitaxial chips.

Figure 2A:
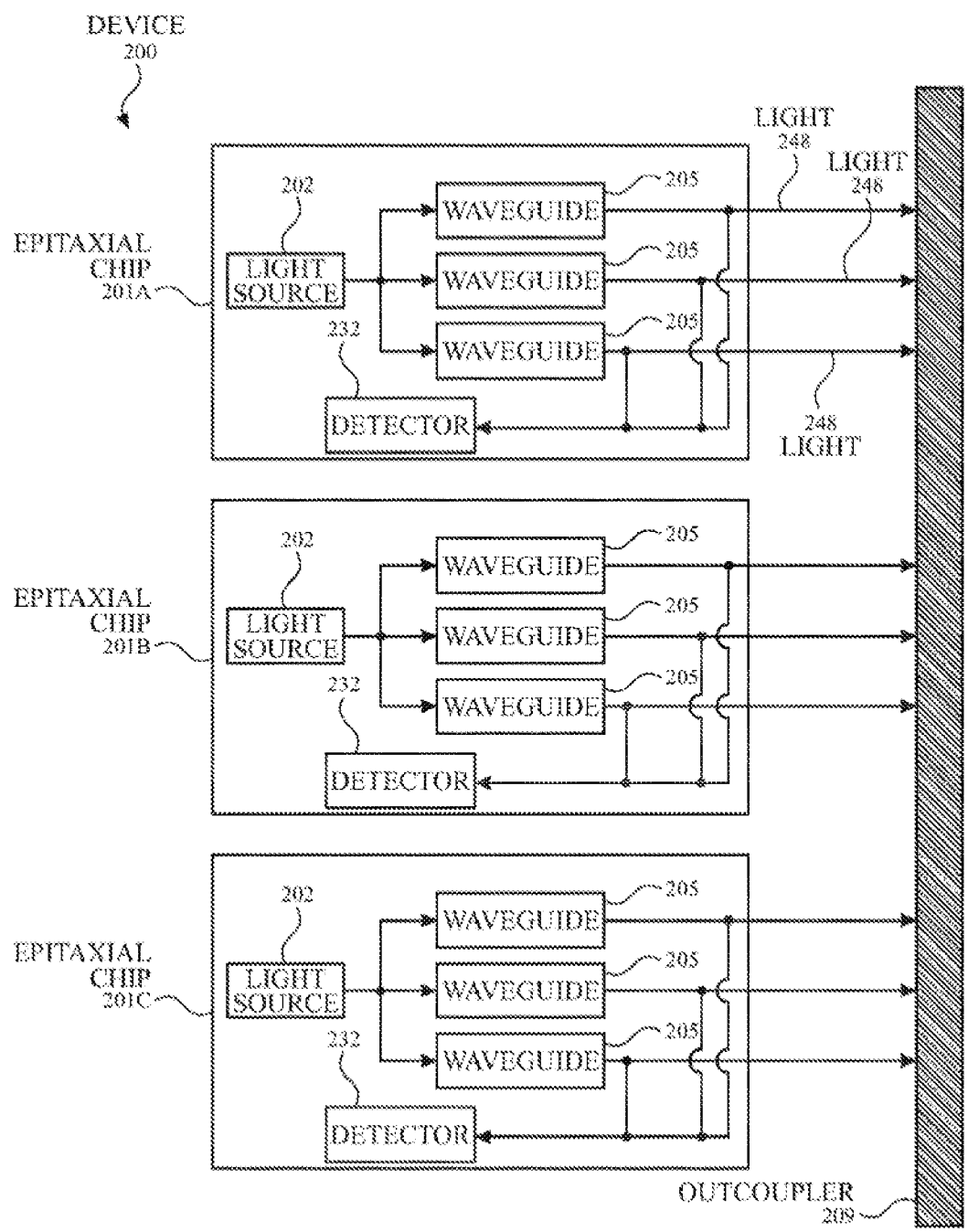
FIG. 2A illustrates a block diagram of an exemplary device including light sources and detectors located on separate epitaxial chips according to examples of the disclosure.

One way to reduce the number of epitaxial chips and the complexity can be to integrate a light source and a detector on the same epitaxial chip. FIG. 2A illustrates a block diagram of an exemplary device including light sources and detectors located on separate epitaxial chips according to examples of the disclosure. The device 200 can include a plurality of epitaxial chips 201. Each epitaxial chip 201 can be configured to emit light 248 towards the outcoupler 209. Light 248 can be directed along multiple path ways using waveguides 205, for example. The outcoupler 209 can redirect light 248 out of the device 200, as discussed earlier. In some examples, one or more epitaxial chips 201 can have one or more optical properties (e.g., band structure) that differ from other epitaxial chips 201. For example, the epitaxial chip 201A can be configured to emit light having a first range of wavelengths (e.g., red colors), the epitaxial chip 201B can be configured to emit light having a second range of wavelengths (e.g., green colors), and the epitaxial chip 201C can be configured to emit light having a third range of wavelengths (e.g., blue colors). The collection of epitaxial chips 201 can allow the device 200 to emit a broader range of wavelengths (e.g., red, green, and blue colors) than a single epitaxial chip 201.

Figure 2B:
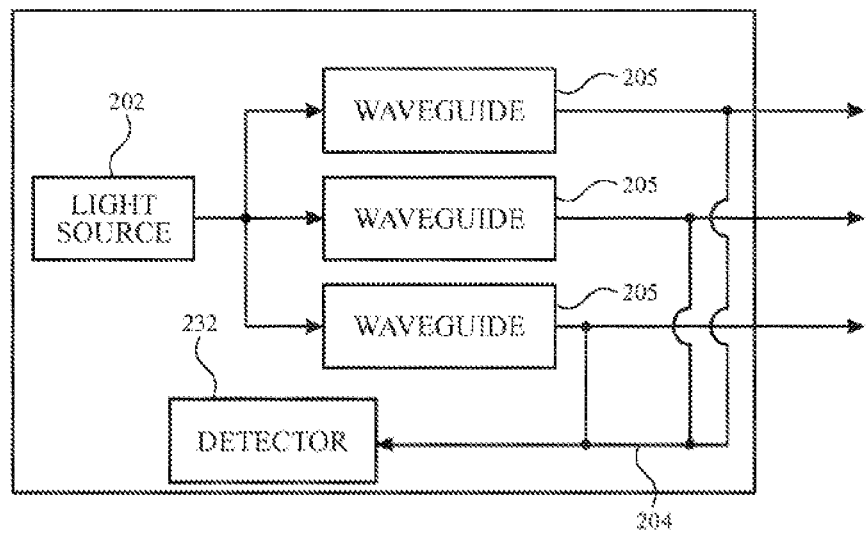
FIG. 2B illustrates a block diagram of an exemplary portion of an epitaxial chip according to examples of the disclosure.

FIG. 2B illustrates a block diagram of an exemplary epitaxial chip according to examples of the disclosure. The epitaxial chip 201 can include a light source 202, one or more waveguides 205 (optional), and a detector 232. In some examples, the epitaxial chip 201 can include a plurality of discrete detectors associated with individual waveguides. The output from one or more of the waveguides 205 can be routed (e.g., via optical traces) to the detector 232 such that the detector 232 can measure the optical properties (e.g., monitor the power density) of light emitted by the light source 202. The detector 232 and the optical traces (e.g., associated with optical signal 204) can be located on the same epitaxial chip, and the epitaxial chips 201 can operate independently (discussed below) such that light can be generated and the properties of the generated can be measured without the need for additional epitaxial chips, for example. Based on the measured optical properties, the detector 232 can communicate with a controller (not shown), for example, to adjust one or more waveforms to drive the light source 202.

Figure 2C:
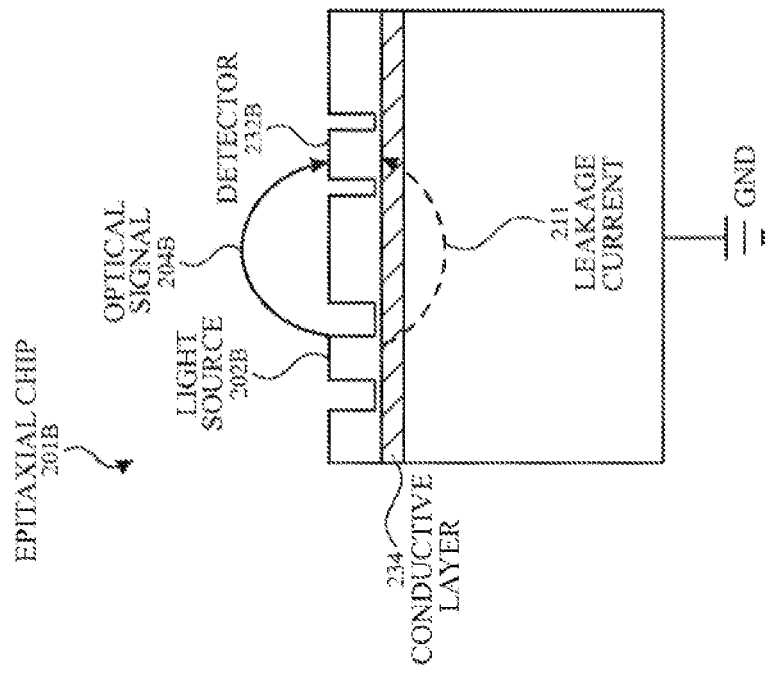
FIG. 2C illustrates a cross-sectional view of a plurality of independently operable epitaxial chips according to examples of the disclosure.
Figure 2C:
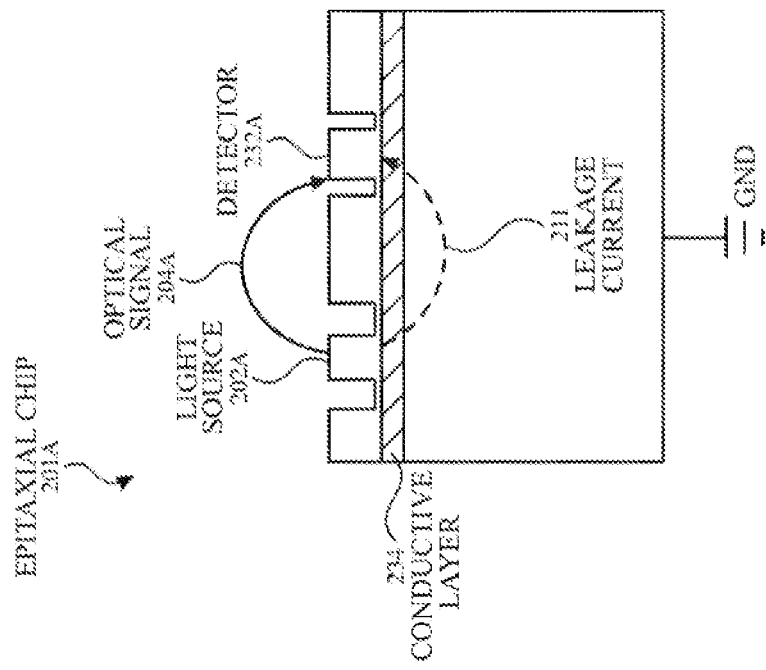

FIG. 2C illustrates a cross-sectional view of a plurality of independently operable epitaxial chips according to examples of the disclosure. Epitaxial chip 201A can include a light source 202A and a detector 232A. Epitaxial chip 201B can include a light source 202B and a detector 232B. Within a given epitaxial chip, the detector (e.g., detector 232A) can be configured for measuring the optical properties of light emitted by the light source (e.g., light source 202A) by way of an optical signal (e.g., optical signal 204A). During operation, the light source and the detector included in the same epitaxial chip can be driven simultaneously. That is, the epitaxial chips can operate independently (e.g., optical signals 204 may not be shared between epitaxial chips). One effect of driving the light source and the detector simultaneously can be leakage current 211. The leakage current 211 can flow from the light source through a conduction portion (e.g., conductive layers 234) to the detector in the same epitaxial chip. In some instances, the amount of leakage current 211 can be higher than the detector current, which can cause the leakage current to mask the detector current. Masking the detector current can reduce the detector's likelihood of accurately determining the optical properties of the emitted light.

Figure 3A:
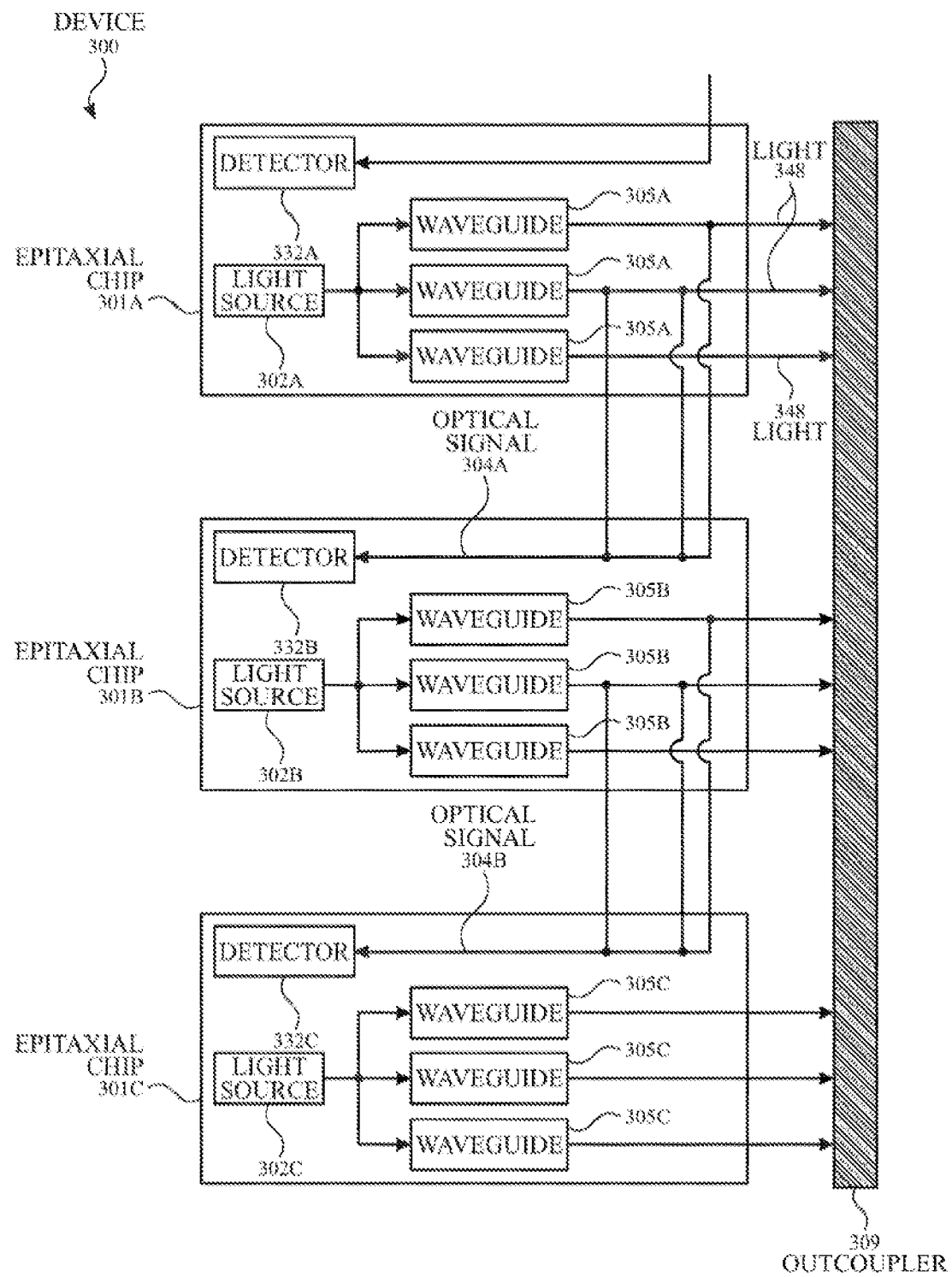
FIG. 3A illustrates a top-view of a plurality of dependently operable epitaxial chips according to examples of the disclosure.

One way to reduce (or eliminate) the leakage current can be to configure the epitaxial chips to operate dependently. FIG. 3A illustrates a block diagram of an exemplary device including light sources according to examples of the disclosure. The device 300 can include a plurality of epitaxial chips 301. Each epitaxial chip 301 can include a plurality of waveguides 305 and can be configured to emit light 348 towards the outcoupler 309. The outcoupler 309 can redirect light 348 out of the device 300, as discussed earlier. In some examples, one or more epitaxial chips 301 can have one or more optical properties (e.g., band structure) that differ from other epitaxial chips 301. For example, the epitaxial chip 301A can be configured to emit light having a first range of wavelengths (e.g., red colors), the epitaxial chip 301B can be configured to emit light having a second range of wavelengths (e.g., green colors), and the epitaxial chip 301C can be configured to emit light having a third range of wavelengths (e.g., blue colors).

Each epitaxial chip 301 can include a light source 302 and a detector 332. For example, the epitaxial chip 301A can include a light source 302A and a detector 332A. The epitaxial chip 301B can include at least one light source 302B and at least one detector 332B, and the epitaxial chip 301C can include a light source 302C and a detector 332C. The epitaxial chip 301A can be located adjacent (i.e., no other epitaxial chips located in between) to the epitaxial chip 301B, which can be located adjacent to the epitaxial chip 301C.

In some examples, the light source 302 and the detector 332 included on the same epitaxial chip 301 can be grown and engineered from the same epitaxial wafer. That is, the materials included in the light source 302 and the detector 332 included in the same epitaxial chip 301 can be the same. By using different biasing schemes, the same materials can be configured to operate differently. That is, the light source 302 can be configured to operate as a light emitter, and the detector 332 can be configured as a light sensor. For example, a positive bias (e.g., +2V) can be applied to the light source 302, while a negative bias (e.g., −2V) can be applied to the detector 332.

The detector (e.g., detector 332B) located on one epitaxial chip (e.g., epitaxial chip 301B) can be configured for measuring the optical properties of light emitted by a light source (e.g., light source 302A) located on another epitaxial chip (e.g., epitaxial chip 301A) by way of the optical signal (e.g., optical signal 304A) associated with the respective linked light source-light detector set. In some examples, within a linked light source-light detector set, the detector can be included in an epitaxial chip proximate (e.g., adjacent) to the epitaxial chip that the light source is included in. Examples of the disclosure can include any number of light sources and light detectors included in a linked light source-light detector set.

As an example, the detector 332B can measure the optical properties of the optical signal 304A from the light source 302A. As another example, the detector 332C can measure the optical properties of the optical signal 304B from the light source 302B. In this manner, the epitaxial chips 301 can operate dependently. The outcoupler 309 may receive the same light 348 and may not be affected by dependent operation of the epitaxial chips 301. By electrically separating the light source and the detector onto different epitaxial chips 301, the leakage current (e.g., leakage current 211 illustrated in FIG. 2C) between the two optical components can be prevented or reduced.

Although the figure illustrates three epitaxial chips, examples of the disclosure can include any number of epitaxial chips. Additionally, although the figure illustrates each epitaxial chip as including one light source, three waveguides, and one detector, examples of the disclosure are not limited to these specific numbers of optical components on a given epitaxial chip 201. Additionally, examples of the disclosure are not limited to these types of optical components.

Figure 3B:
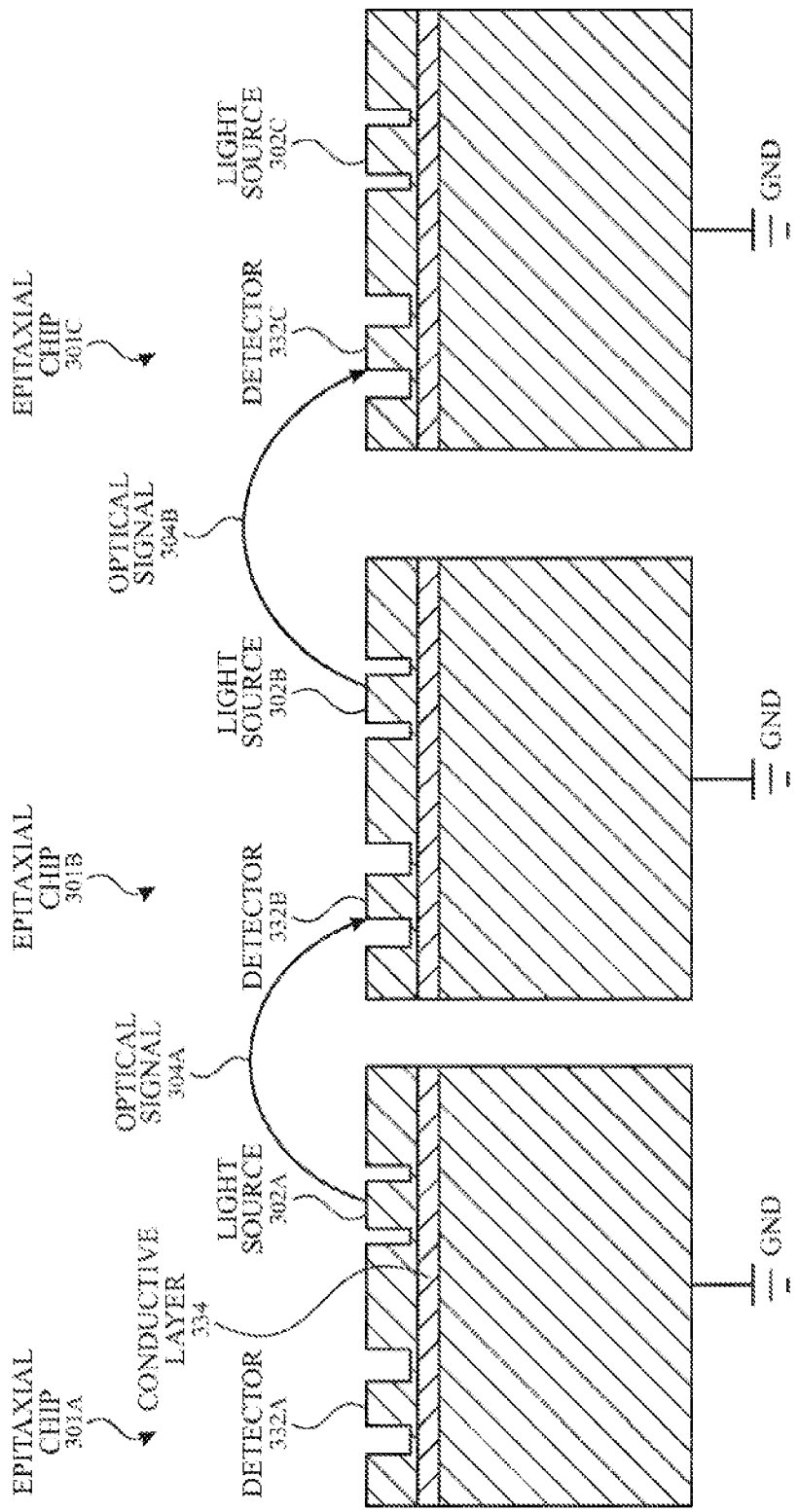
FIG. 3B illustrates a cross-sectional view of a plurality of dependently operable epitaxial chips according to examples of the disclosure.

FIG. 3B illustrates a cross-sectional view of a plurality of dependently operable epitaxial chips according to examples of the disclosure. As discussed above, the detector (e.g., detector 332B) on a third epitaxial chip (e.g., epitaxial chip 301B) can be configured to measure the optical properties of light emitted by the light source (e.g., light source 302A) on a first epitaxial chip (e.g., 301A). During operation, the light source (e.g., light source 302B) on the third epitaxial chip (e.g., epitaxial chip 301B) may be activated (e.g., emitting light) at the same time as the detector (e.g., detector 332B) located on the same epitaxial chip. In some instances, a leakage current may exist between the light source and the detector on the same epitaxial chip even if the leakage current may be associated with a different optical signal than the detector is associated with. For example, simultaneous operation of the epitaxial chip 301A and the epitaxial chip 301B can cause leakage current to flow from the light source 302B to the detector 332B on the epitaxial chip 301B. The detector 332B may produce an electrical signal, which may include an indication of one or more properties of the optical signal 304A. The electrical signal may also incorrectly include the leakage current (e.g., from light source 302B) from the light source 302B. To prevent or reduce the leakage current, the epitaxial chips can be operated in a certain manner (discussed in detail below).

Although the figure illustrates one detector measuring the optical properties of one light source, examples of the disclosure can include any number of detectors optically coupled to any number of light sources. For example, one detector can measure the optical properties of multiple light sources via optical signals routed using optical traces. The optical signals from the multiple light sources can be combined or may be transmitted in a time-multiplexed manner to the detector. As another example, the optical properties of one light source can be measured by multiple detectors. Additionally or alternatively, examples of the disclosure are not limited epitaxial chips including different types of optical components. For example, at least one epitaxial chip can include only light source(s) and at least one epitaxial chip can include only detector(s).

Figure 4A:
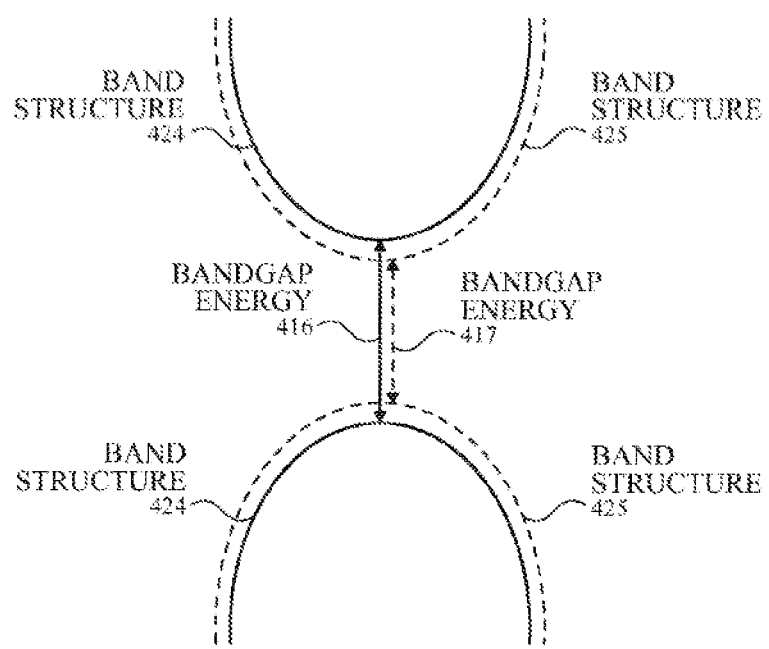
FIG. 4A illustrates a change in the band structure of an exemplary light sensor with temperature according to examples of the disclosure.

In addition to reducing the leakage current, dependently operable epitaxial chips can exploit the operating temperature differences between the two different optical components. FIG. 4A illustrates a change in the band structure of an exemplary light sensor with temperature according to examples of the disclosure. At a first temperature (e.g., the temperature before the laser begins lasing), the light source can have a band structure 424 that includes bandgap energy 416. The emission wavelength of the emitted light can correspond to its bandgap energy, so a change in the bandgap energy can change the emission wavelength. At a second temperature (e.g., the temperature after the laser begins lasing, which can be a higher temperature), the light source can have a band structure 425 that includes a bandgap energy 417. In some examples, the first temperature can be the temperature of the light source while the light source is inactive (e.g., no drive waveform is applied), and the second temperature can be the temperature of the light source while the light source is active (e.g., a non-zero drive waveform is applied). That is, an increase in temperature of the light source can reduce its bandgap energy and can shift the emission wavelength to a longer wavelength.

In some instances, the detector may not be as sensitive to temperature changes as the light source. If the light source and the detector are included in the same epitaxial wafer, the materials for both optical components can be the same, as discussed above. When the materials for both optical components are the same, the bandgap energies of both optical components can be the same. If the bandgap of the light source changes due to, e.g., carrier injection, while the bandgap of the corresponding detector does not change, then the difference in bandgaps may prevent the detector from absorbing (i.e., detecting) at least some of the light (e.g., lower energy and longer emission wavelengths) emitted by the light source.

Figure 4B:
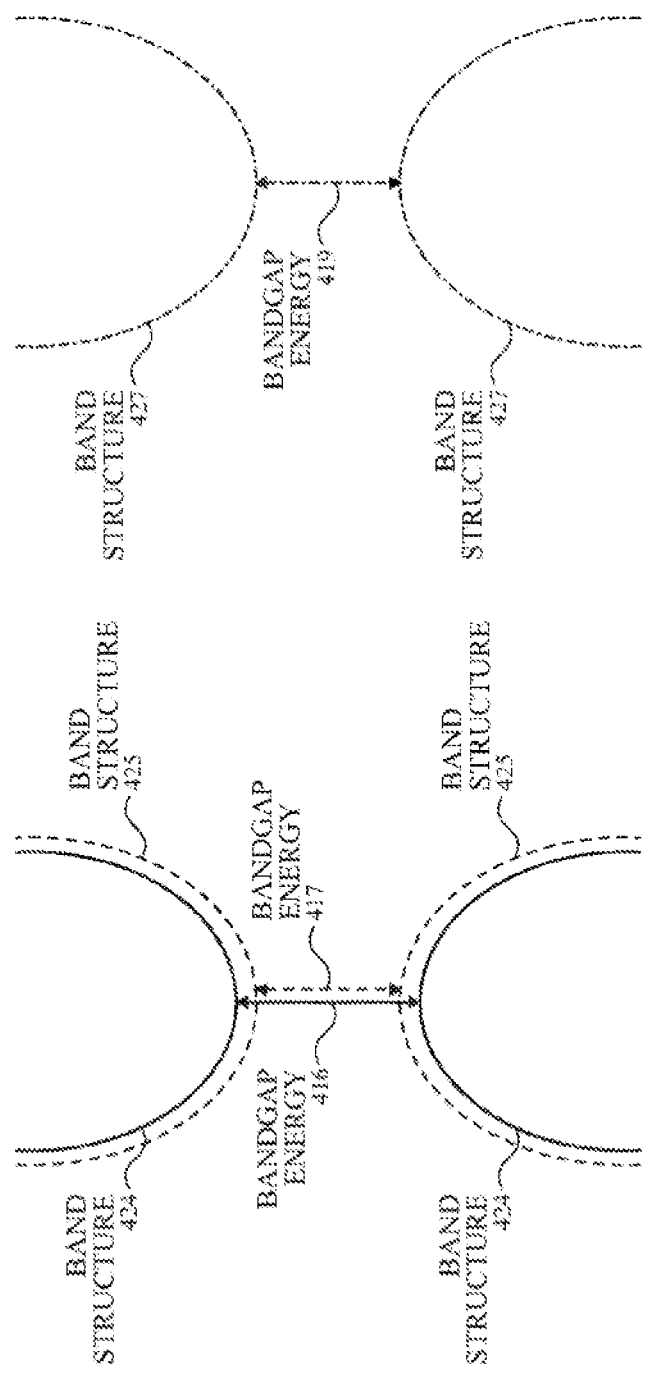
FIG. 4B illustrates the band structures of an exemplary light sensor and an exemplary detector located on different epitaxial wafers according to examples of the disclosure.

If the light source and the detector are included in different epitaxial wafers (e.g., epitaxial wafers grown with different materials having different bandgaps), then differences in bandgaps can be reduced. FIG. 4B illustrates the band structures of an exemplary light sensor and an exemplary detector located on different epitaxial wafers according to examples of the disclosure. For example, the light source can be included in an epitaxial chip having a longer bandgap (e.g., due to a difference in the material growth) than the epitaxial chip that the detector may be included in. As discussed above, the light source can have a band structure 424 that includes bandgap energy 416 at a first temperature. The light source can undergo an optical shift to the band structure 425 and bandgap energy 417 at a second (e.g., higher than the first) temperature. The detector can have a band structure 427 that includes bandgap energy 419 at both first and second temperatures. In some examples, the bandgap energy 417 and the bandgap energy 419 can be the same. When active, the difference in bandgaps can be little to none and can allow the detector to absorb most or all of the emitted light.

Figure 4C:
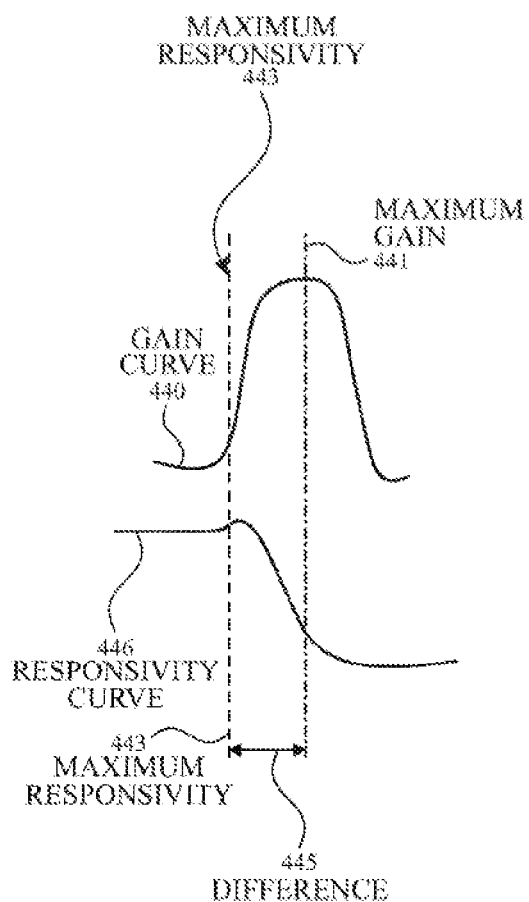
FIG. 4C illustrates a gain curve from an exemplary light source and a responsivity curve from an exemplary detector, where the epitaxial chips can be independently operated according to examples of the disclosure.
Figure 4D:
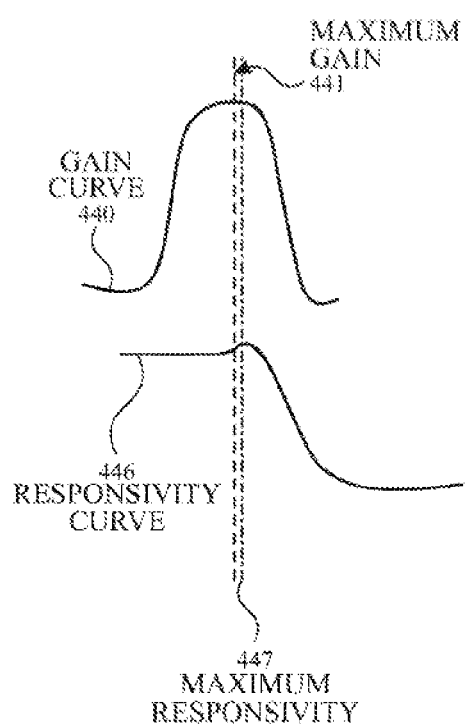
FIG. 4D illustrates a gain curve from an exemplary light source and a responsivity curve from an exemplary detector located on dependently operable epitaxial chips according to examples of the disclosure.

Dependently operating the epitaxial chips can also increase the efficiency of the device. FIG. 4C illustrates a gain curve from an exemplary light source and a responsivity curve from an exemplary detector, where the epitaxial chips can be independently operated according to examples of the disclosure. The light source can have a gain curve 440, and the detector can have a responsivity curve 446. As illustrated in the figure, the wavelength where the maximum gain 441 of the light source occurs can differ from the wavelength where the maximum responsivity 443 of the detector occurs, and this is referred to as the difference 445. Dependently operating the epitaxial chips can shift the responsivity curve 446 of the detector relative to the gain curve 440 of the light source, as illustrated in FIG. 4D. The shift in the responsivity curve 443 can allow the maximum gain 441 of the light source to be located closer (e.g., within 5%) to the maximum responsivity 447 of the detector, which can increase the efficiency of the device.

Figure 5:
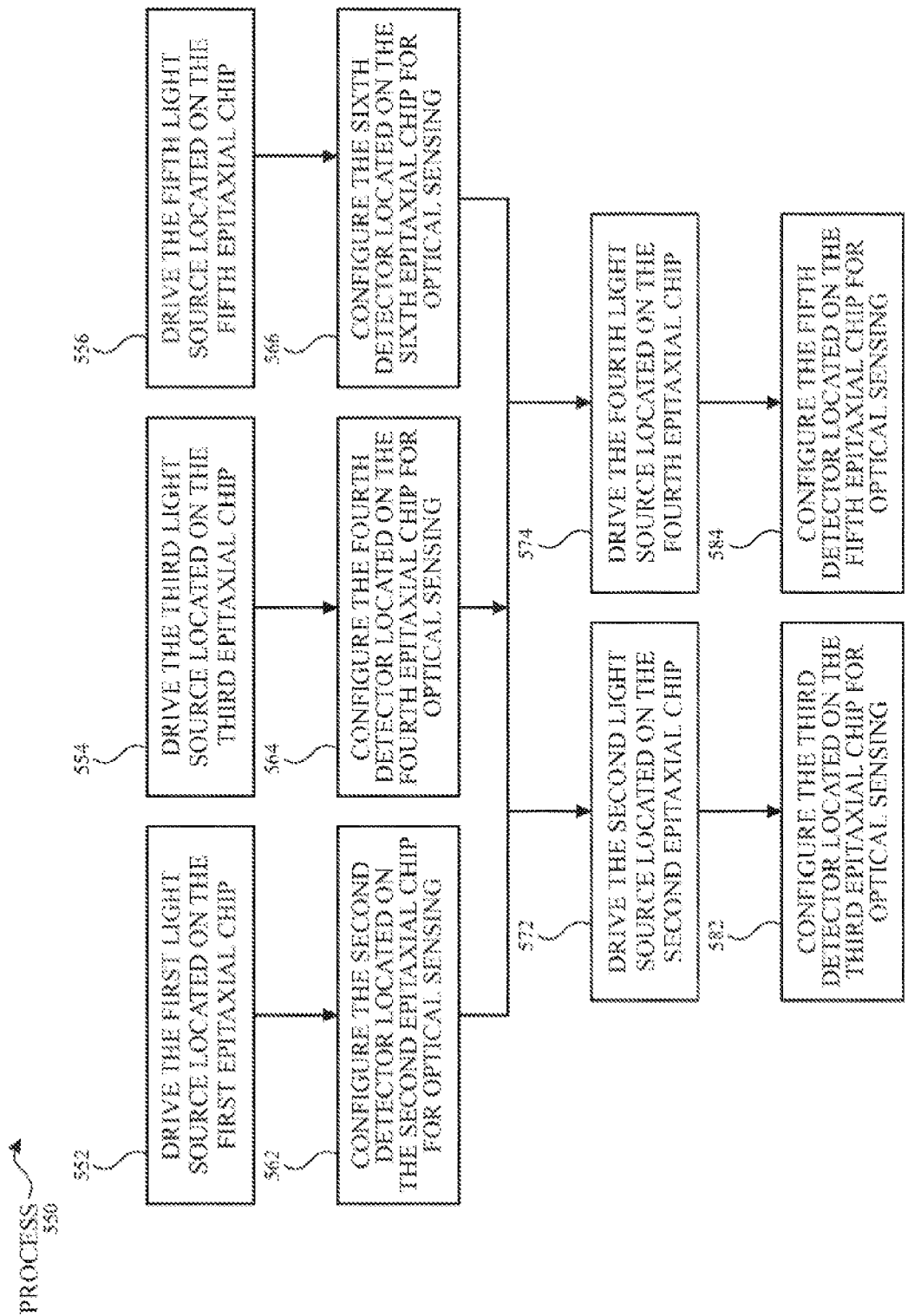
FIG. 5 illustrates an exemplary flow for operating a device including a plurality of dependently operable epitaxial chips according to examples of the disclosure.

FIG. 5 illustrates an exemplary flow for operating the device including a plurality of dependently operable epitaxial chips according to examples of the disclosure. Light source(s) located on one or more first epitaxial chips can be driven, while the detectors located on the respective linked epitaxial chip(s) can be configured for optical sensing during a first time period. In this manner, the linked epitaxial chips may not be configured with the same mode of operation at the same time. For example, linked epitaxial chips can include a pair of epitaxial chips, where one epitaxial chip can be emitting light and the other epitaxial chip can be detecting light. In some examples, the optical components within a linked light source-light detector set may operate in a time-multiplexed manner.

In some examples, a first epitaxial chip can be surrounded by a second epitaxial chip, and a second epitaxial chip can be surrounded by a first epitaxial chip. During a second time period, the light sources located on the second epitaxial chip(s) can be driven, while the detectors located on the first epitaxial chip(s) can be configured for optical sensing. For example, every even epitaxial chip can be configured for light emission, and every odd epitaxial chip can be configured for detecting the optical properties of the emitted light. Each optical component of a linked (e.g., sharing an optical signal) of light source-light detector set can be activated simultaneously.

In some examples, the light source can be driven before the detector belonging to the same light source-light detector pair begins sensing. For example, the device can include six epitaxial chips. The first light source located on the first epitaxial chip, the third light source located on the third epitaxial chip, and the fifth light source located on the fifth epitaxial chip can be driven (step 552, step 554, and step 556 of process 550). In some instances, the first light source, the third light source, etc. can be operated simultaneously. The second detector located on the second epitaxial chip, the fourth detector located on the fourth epitaxial chip, and the sixth detector located on the sixth epitaxial chip can be configured for optical sensing (step 562, step 564, and step 566 of process 550). In some instances, the second detectors, the fourth detector, etc. can be operated simultaneously. The second light source located on the second epitaxial chip, and the fourth light source located on the fourth epitaxial chip can be driven (step 572 and step 574 of process 550). The third detector located on the third epitaxial chip, and the fifth detector located on the fifth epitaxial chip can be configured for optical sensing (step 582 and step 584 of process 550).

Figure 6:
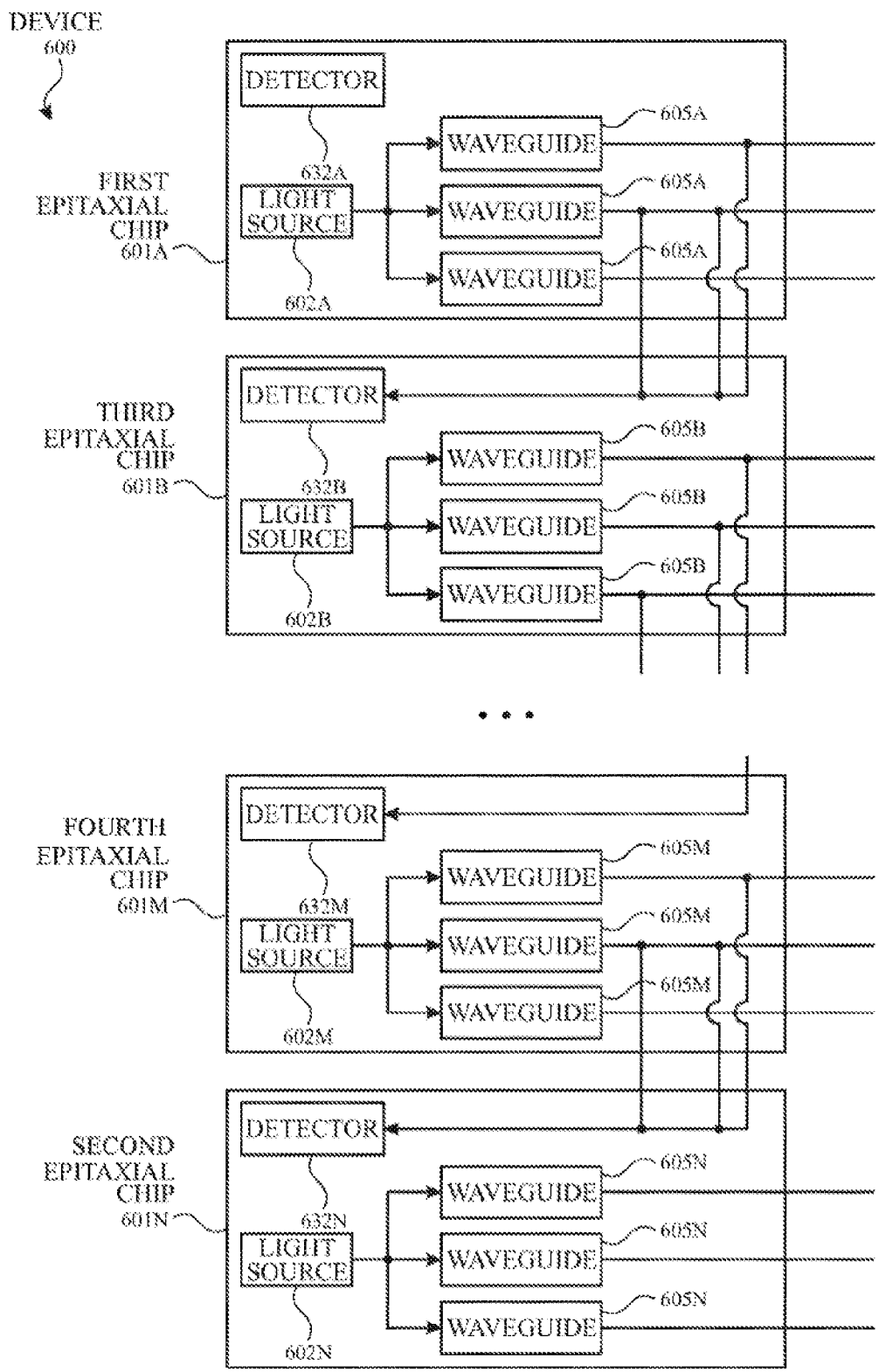
FIG. 6 illustrates a block diagram of an exemplary device including a plurality of epitaxial chips according to examples of the disclosure.

In some examples, the first and/or second epitaxial chips may have one or more structures and/or functionalities different from the other epitaxial chips. FIG. 6 illustrates a block diagram of an exemplary device including a plurality of epitaxial chips according to examples of the disclosure. Device 600 can include a plurality of epitaxial chips 601. The plurality of epitaxial chips 601 can include the first epitaxial chip 601A and the second epitaxial chip 601N, where the remaining epitaxial chips 601B-601M can be located between the first epitaxial chip 601A and the second epitaxial chip 601N. For example, the first epitaxial chip 601A may only have one neighboring chip (e.g., the third epitaxial chip 601B).

The detector (e.g., detector 632A) of the first epitaxial chip 601A may not be associated with an optical signal 604. The detector (e.g., the detector 632A) of the first epitaxial chip may then be inactive (e.g., a "dummy" detector). That is, the "dummy" detector 632A may have a structure located on the first epitaxial chip 601A, but a bias may not be applied across the dummy detector 632A. In some examples, the first epitaxial chip 601A may not include a detector (not shown), and instead, may only include a light source (e.g., light source 602A). Alternatively, the detector of the first epitaxial chip 601A may not be connected (i.e., deactivated) to any circuitry used for operating the detector, while the other detectors located on other epitaxial chips may be connected to circuitry. In this manner, some or all of the epitaxial chips can be grown and processed in the same manner, where the operation of some (e.g., first and/or second) epitaxial chips can be different than the operation of other epitaxial chips.

Similarly, the second epitaxial chip 601N (e.g., the tenth epitaxial chip in a device having a total of ten epitaxial chips) may only have one neighboring chip (e.g., fourth epitaxial chip 601M), so the light source (e.g., light source 602N) of the second epitaxial chip 601N may not be associated with an optical signal 604 measured by a detector. In some instances, the light source of the second epitaxial chip 601N may be measured by a detector located on the same epitaxial chip 601N. The detector (e.g., detector 632N) may be configured to measure the optical properties of light emitted from multiple light sources (e.g., light source 602M and light source 602N). The optical signals can be combined and collectively measured by the detector or may be time-multiplexed.

The light source (e.g., light source 602N) of the second epitaxial chip 601N may be inactive (e.g., a "dummy" light source). In some examples, the second epitaxial chip 601N may not include a light source, and instead, may only include a detector 632N. Alternatively, the light source of the second epitaxial chip 601N may not be connected (i.e., deactivated) to circuitry used to operate the light source, while the other light sources of the other epitaxial chips may be connected to circuitry. In some examples, the second epitaxial chip 601N may include a light source 602N whose optical properties may not be directly measured by a detector. In some examples, an epitaxial chip (e.g., the second epitaxial chip 601N) can include the same materials as its neighboring epitaxial chip (e.g., a fourth epitaxial chip 601M), but may be configured to operate with a different (e.g., smaller) bandgap energy by heating or cooling the epitaxial chip to a different (e.g., higher) temperature.

Although not shown in the figure, examples of the disclosure can include one or more epitaxial chips that may different in the type of optical components relative to the other epitaxial chips. For example, the first epitaxial chip 601A may not include a detector and/or the second epitaxial chip 601N may not include a light source. Additionally or alternatively, the epitaxial chips can include optical components isolated from other optical components on the same epitaxial chips using, e.g., one or more trenches (discussed below).

Figure 7:
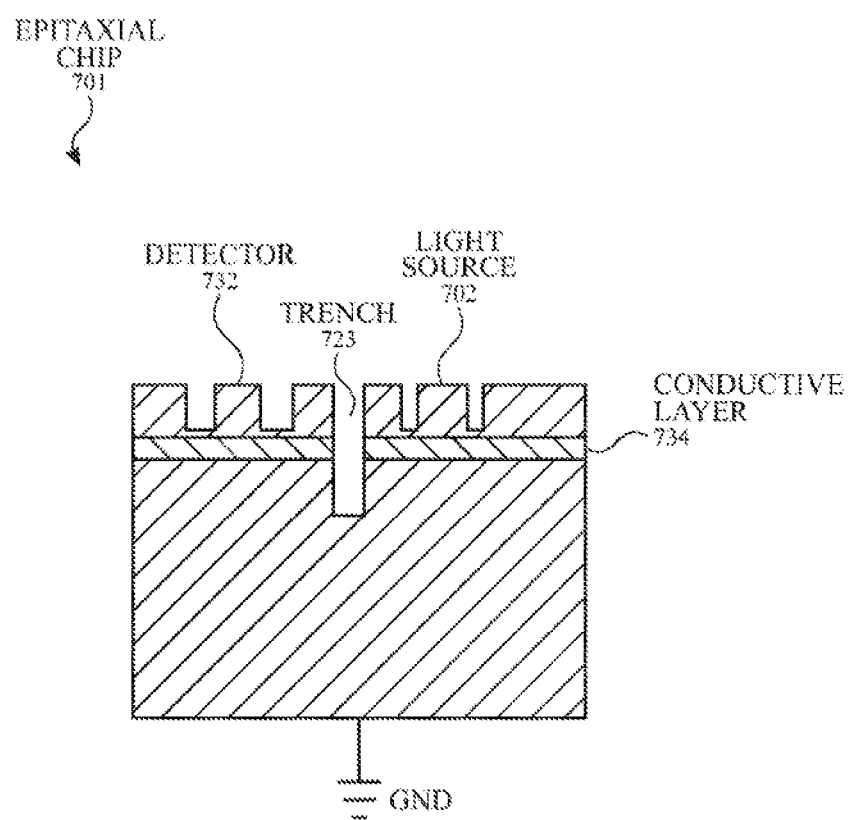
FIG. 7 illustrates a cross-sectional view of an exemplary epitaxial wafer including a trench for electrical isolation according to examples of the disclosure.

Another way to reduce the amount of leakage current included in the signal can be to electrically isolate the light source and the detector included in the same epitaxial chip. FIG. 7 illustrates a cross-sectional view of an exemplary epitaxial wafer including a trench for electrical isolation according to examples of the disclosure. Epitaxial chip 701 can include a light source 702 and a detector 732 formed from a stack of materials including a conductive layer 734. A trench 723 can be formed between the light source 702 and the detector 732 to electrically isolate the structures. In some examples, the trench 723 can be deeper (e.g., relative to the top of the epitaxial chip 701) than the conductive layer 734 such that a path for leakage current may not form between the light source 702 and the detector 732. In some examples, with the electrically isolated structures, the device can include heaters coupled to the light source, the detector, or both. The heaters may be separate heaters capable of controlling the temperature (e.g., heating one or more structures) independently from others. For example, a first heater can control the temperature of the light source, and a second heater can control the temperature of the detector. The first heater may not affect the temperature of the detector, and the second heater may not affect the temperature of the light source.

Although the figure illustrates the epitaxial chip as including one trench, one light source, and one detector, examples of the disclosure can include any number of trenches, light sources, and detectors.

A device is disclosed. The device can comprise: a plurality of epitaxial chips including a first epitaxial chip and a second epitaxial chip, the first epitaxial chip includes at least one first structure configured as a light source that emits light, and the second epitaxial chip includes at least one second structure configured as a detector that detects light, wherein the emitted light from adjacent epitaxial chips have different optical properties, wherein the second epitaxial chip is configured to detect the light emitted by the at least one first structure included in another of the plurality of epitaxial chips. Additionally or alternatively, in some examples, the plurality of epitaxial chips further includes a subset of epitaxial chips, each subset including: at least one first structure configured as a light source that emits light, and at least one second structure configured as a detector that detects light from at least one first structure in another epitaxial chip. Additionally or alternatively, in some examples, each of the subset of epitaxial chips includes a first material associated with a first bandgap energy, wherein the another epitaxial chip includes a second material associated with a second bandgap energy, wherein the first bandgap energy is different from the second bandgap energy. Additionally or alternatively, in some examples, the first bandgap energy is shorter than the second bandgap energy. Additionally or alternatively, in some examples, the first material changes to the second bandgap energy with an increase in temperature. Additionally or alternatively, at least two of the plurality of epitaxial chips includes different materials associated with different bandgap energies. Additionally or alternatively, the different materials include a first material and a second material and the different bandgap energies include a first bandgap energy and a second bandgap energy, the first material having the first bandgap energy and the second material having the second bandgap energy, wherein the first material is capable of having the second bandgap energy with an increase in temperature. Additionally or alternatively, in some examples, at least one of the subset of epitaxial chips and the second epitaxial chip include the same one or more materials. Additionally or alternatively, in some examples, at least two of the plurality of epitaxial chips includes the same one or more materials. Additionally or alternatively, in some examples, the another epitaxial chip is an adjacent epitaxial chip. Additionally or alternatively, in some examples, the at least one first structure of the first epitaxial chip has a gain curve, wherein the at least one second structure of the second epitaxial chip has a responsivity curve, and wherein a maximum of the gain curve coincides with a maximum of the responsivity curve. Additionally or alternatively, in some examples, the at least one first structure and the at least one second structure of the same epitaxial chip includes the same one or more materials. Additionally or alternatively, in some examples, the first epitaxial chip further includes at least one second structure, the at least one second structure of the first epitaxial chip not configured as a detector that detects light. Additionally or alternatively, in some examples, one or more of the first epitaxial chip and the second epitaxial chip exclude other structures. Additionally or alternatively, in some examples, the second epitaxial chip further includes at least one first structure, the at least one first structure of the second epitaxial chip not configured as a light source that emits light.

A method of operating a device is disclosed. The method can comprise: during a first time period: emitting a first light from a first epitaxial chip using a first structure located on the first epitaxial chip, wherein the first epitaxial chip includes the first structure and a second structure, the first structure configured as a light source that emits light, and the second structure configured as a detector that detects light; and detecting the emitted first light using a second structure located in a second epitaxial chip, wherein the second epitaxial chip includes a first structure and the second structure, the second structure configured as a detector that detects light. Additionally or alternatively, in some examples, the emission of the first light from the first epitaxial chip includes biasing the first structure included in the first epitaxial chip to a first voltage, the method further comprising: biasing the second structure included in the first epitaxial chip to a second voltage, the first voltage different from the second voltage. Additionally or alternatively, in some examples, the emission of the first light from the first epitaxial chip includes increasing a temperature of the first structure included in the first epitaxial chip until a bandgap energy of the first structure in the first epitaxial chip is the same as a bandgap energy of the second structure in the second epitaxial chip. Additionally or alternatively, in some examples, the method further comprises: during the first time period: emitting a second light from a third epitaxial chip using a first structure located on the third epitaxial chip, wherein the third epitaxial chip includes the first structure and a second structure, the first structure configured as a light source that emits light, and the second structure configured as a detector that detects light; and detecting the emitted second light using a second structure located on a fourth epitaxial chip, wherein the fourth epitaxial chip includes a first structure and the second structure, the second structure configured as a detector that detects light, wherein emitting the first light and emitting the second light occur simultaneously. Additionally or alternatively, in some examples, the method further comprising: during a second period: emitting a third light using the first structure located on the second epitaxial chip; detecting the emitted third light using a second structure located on a third epitaxial chip, wherein the third epitaxial chip includes a second structure located on the third epitaxial chip, wherein the third epitaxial chip includes the second structure, the second structure configured as a detector that detects light. Additionally or alternatively, in some examples, the method further comprises: increasing a temperature of the first epitaxial chip until a bandgap energy of the first structure in the first epitaxial chip is different from a bandgap energy of the second epitaxial chip, where the first epitaxial chip and the second epitaxial chip include the same one or more materials. Additionally or alternatively, in some examples, during the first time period: deactivating the second structure included in the first epitaxial chip. Additionally or alternatively, in some examples, the method further comprises: during the first time period: deactivating the first structure included in the second epitaxial chip.

A device is disclosed. The device can comprise: a plurality of epitaxial chips, wherein each epitaxial chip includes: at least one first structure, wherein the first structure is configured as a light source that emits light, and at least one second structure, wherein the second structure is configured as a detector that detects light, wherein: at least one of the plurality of epitaxial chips includes a conductive layer configured as a waveguide for the light source, and a trench configured to electrically isolate the at least one first structure from the at least one second structure, wherein the trench is formed deeper than the conductive layer.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

The invention claimed is:

1. A device comprising:
a plurality of epitaxial chips including a first epitaxial chip and a second epitaxial chip,
the first epitaxial chip includes a first light source that emits first light and a first detector capable of detecting light, and
the second epitaxial chip includes a second light source that emits second light and a second detector that detects the first light,
wherein the first light and the second light have different optical properties.

2. The device of claim 1, wherein the first epitaxial chip includes a first material having a first bandgap energy at a temperature, and the second epitaxial chip includes a second material having a second bandgap energy at the temperature.

3. The device of claim 2, wherein the first material is capable of having the second bandgap energy with an increase in the temperature.

4. The device of claim 1, wherein the first epitaxial chip is adjacent to the second epitaxial chip.

5. The device of claim 1, wherein the first light source has a maximum gain at a wavelength, and
wherein the second light source has a maximum responsivity at the wavelength.

6. The device of claim 1, the device further comprising circuitry to operate the plurality of epitaxial chips, where the first detector is not connected to the circuitry.

7. The device of claim 1, the device further comprising circuitry to operate the plurality of epitaxial chips, wherein the plurality of epitaxial chips further includes a third epitaxial chip, the third epitaxial chip includes a third light source capable of emitting light, wherein the third light source is not connected to the circuitry.

8. The device of claim 1, wherein the plurality of epitaxial chips includes a third epitaxial chip, the third epitaxial chip including a light source and no detector.

9. The device of claim 1, wherein the plurality of epitaxial chips includes a third epitaxial chip, the third epitaxial chip including a detector and no light source.

10. The device of claim 1, wherein the plurality of epitaxial chips each include a plurality of waveguides.

11. A method of operating a device, the method comprising:
during a first time period:
emitting a first light from a first light source included in a first epitaxial chip,
wherein the first epitaxial chip includes the first light source and a first detector;
detecting the first light using a second detector included in a second epitaxial chip,
wherein the second epitaxial chip includes a second light source and the second detector; and
during a second time period:
emitting a second light from the second light source, wherein the first light has a first bandgap energy and the second light has a second bandgap energy.

12. The method of claim 11, wherein the emission of the first light from the first light source includes biasing the first light source to a first voltage, the method further comprising:
during a third time period:
biasing the first detector to a second voltage, the first voltage different from the second voltage.

13. The method of claim 11, wherein the emission of the first light from the first light source includes increasing a temperature of the first light source until the first bandgap energy is equal to the second bandgap energy.

14. The method of claim 11, the method further comprising:
during the first time period:
emitting a third light from a third light source included in a third epitaxial chip; and
detecting the third light using a fourth detector included in a fourth epitaxial chip,
wherein the first light and the third light are emitted simultaneously.

15. The method of claim 14, wherein the first light and the third light are detected simultaneously.

16. The method of claim 11, the method further comprising:
during the second period:
emitting a fourth light from a fourth light source, the fourth light source included in a fourth epitaxial chip,
wherein the second light and the fourth light are emitted simultaneously.

17. The method of claim 11, further comprising:
during the first time period, deactivating the first detector.

18. The method of claim 11, further comprising:
during the first time period, deactivating the second light source.

* * * * *